(12) United States Patent
Sasaki

(10) Patent No.: US 9,725,823 B2
(45) Date of Patent: Aug. 8, 2017

(54) SILICON CARBIDE CRYSTAL AND METHOD OF MANUFACTURING SILICON CARBIDE CRYSTAL

(71) Applicant: SUMITOMO ELECTRIC INDUSTRIES, LTD., Osaka-shi, Osaka (JP)

(72) Inventor: Makoto Sasaki, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 12 days.

(21) Appl. No.: 15/185,602

(22) Filed: Jun. 17, 2016

(65) Prior Publication Data

US 2016/0289863 A1  Oct. 6, 2016

Related U.S. Application Data

(60) Division of application No. 14/019,882, filed on Sep. 6, 2013, now abandoned, which is a continuation of
(Continued)

(30) Foreign Application Priority Data

Apr. 26, 2010 (JP) .................. 2010-100891

(51) Int. Cl.
C30B 23/02 (2006.01)
C30B 23/00 (2006.01)
(Continued)

(52) U.S. Cl.
CPC ............ *C30B 23/025* (2013.01); *C30B 23/00* (2013.01); *C30B 23/02* (2013.01); *C30B 29/36* (2013.01);
(Continued)

(58) Field of Classification Search
None
See application file for complete search history.

(56) References Cited

U.S. PATENT DOCUMENTS 5,863,325 A   1/1999  Kanemoto et al.
7,018,597 B2  3/2006  Ellison et al.
(Continued)

FOREIGN PATENT DOCUMENTS

CN  101536168 A  9/2009
JP  63-50393      3/1988
(Continued)

OTHER PUBLICATIONS

Translation JP 2005-239496; 2016.*
(Continued)

*Primary Examiner* — Guinever S Gregorio
(74) *Attorney, Agent, or Firm* — Drinker Biddle & Reath LLP

(57) ABSTRACT

An SiC crystal (10) has Fe concentration not higher than 0.1 ppm and Al concentration not higher than 100 ppm. A method of manufacturing an SiC crystal includes the following steps. SiC powders for polishing are prepared as a first source material (17). A first SiC crystal (11) is grown by sublimating the first source material (17) through heating and precipitating an SiC crystal. A second source material (12) is formed by crushing the first SiC crystal (11). A second SiC crystal (14) is grown by sublimating the second source material (12) through heating and precipitating an SiC crystal. Thus, an SiC crystal and a method of manufacturing an SiC crystal capable of achieving suppressed lowering in quality can be obtained.

4 Claims, 2 Drawing Sheets

Related U.S. Application Data application No. 13/499,482, filed as application No. PCT/JP2011/054339 on Feb. 25, 2011, now Pat. No. 8,574,529.

(51) Int. Cl.
  *C30B 29/36* (2006.01)
  *C30B 35/00* (2006.01)
  *H01L 21/02* (2006.01)

(52) U.S. Cl.
  CPC ...... *C30B 35/007* (2013.01); *H01L 21/02378* (2013.01); *H01L 21/02529* (2013.01); *H01L 21/02631* (2013.01); *Y10T 428/21* (2015.01); *Y10T 428/24355* (2015.01); *Y10T 428/2982* (2015.01)

(56) References Cited

U.S. PATENT DOCUMENTS

| | | | |
|---|---|---|---|
| 7,553,373 | B2 | 6/2009 | Otsuki et al. |
| 2006/0249073 | A1 | 11/2006 | Asaoka et al. |
| 2006/0254507 | A1 | 11/2006 | Otsuki et al. |
| 2008/0067524 | A1 | 3/2008 | Basceri et al. |
| 2008/0083366 | A1 | 4/2008 | Basceri et al. |
| 2008/0190355 | A1 | 8/2008 | Chen et al. |
| 2011/0206929 | A1 | 8/2011 | Nakabayashi et al. |

FOREIGN PATENT DOCUMENTS

| | | |
|---|---|---|
| JP | 63-50399 A | 3/1988 |
| JP | 9-48605 | 2/1997 |
| JP | 9-157091 | 6/1997 |
| JP | 2004-292305 | 10/2004 |
| JP | 2005-8473 | 1/2005 |
| JP | 2005-239496 | 9/2005 |
| JP | 2005-314217 | 11/2005 |
| JP | 2007-284306 A | 11/2007 |
| JP | 2010-83681 | 4/2010 |
| WO | WO 2010/044484 A1 | 4/2010 |

OTHER PUBLICATIONS

Nakamura et al.; Ultrahigh-Quality Silicon Carbide Single Crystals; Nature; vol. 430; Aug. 26, 2004.

Kanaya, Masatoshi, et al., "Development of Single-Crystalline SiC Boule Fabrication Technology as Substrate Material for Electronic Devices," Materia Japan, Apr. 1997, vol. 36, No. 4, pp. 370-372 (with partial English-language translation attached).

\* cited by examiner

SILICON CARBIDE CRYSTAL AND METHOD OF MANUFACTURING SILICON CARBIDE CRYSTAL

This is a divisional application of copending application Ser. No. 14/019,882, having a filing date of Sep. 6, 2013, which is a continuation application of prior application Ser. No. 13/499,482, having a §371 date of Mar. 30, 2012, which is a national stage filing based on PCT International Application No. PCT/JP2011/054339, filed on Feb. 25, 2011. The copending application Ser. Nos. 14/019,882 and 13/499,482 are incorporated by reference herein in their entireties.

TECHNICAL FIELD

The present invention relates to a silicon carbide crystal (SiC) and a method of manufacturing an SiC crystal.

BACKGROUND ART

An SiC crystal has a large band gap and also has maximum breakdown electric field and thermal conductivity higher than those of silicon (Si), and the SiC crystal has carrier mobility as high as that of Si and it is high also in electron saturation drift velocity and breakdown voltage. Therefore, application to a semiconductor device required to achieve higher efficiency, higher breakdown voltage and larger capacity is expected.

An SiC crystal employed in such a semiconductor device is manufactured with a sublimation method representing a vapor phase epitaxy method, as disclosed, for example, in Japanese Patent Laying-Open No. 2005-008473 (PTL 1), Japanese Patent Laying-Open No. 2005-314217 (PTL 2), and the like.

PTL 1 discloses lowering in nitrogen concentration in a grown SiC crystal by using a graphite crucible of which impurity nitrogen concentration is not higher than 50 ppm for growing an SiC crystal. PTL 2 discloses a method of growing an SiC crystal by using a carbon source material having boron concentration not higher than 0.11 ppm and a silicon source material having boron concentration not higher than 0.001 ppm.

CITATION LIST

Patent Literature

PTL 1: Japanese Patent Laying-Open No. 2005-008473
PTL 2: Japanese Patent Laying-Open No. 2005-314217

SUMMARY OF INVENTION

Technical Problem

The present inventor noted use of SiC powders for polishing (hereinafter also referred to as GC (Green Silicon Carbide)) as a source material for growing an SiC crystal. This GC contains a large amount of impurities such as aluminum (Al) and iron (Fe) and it is difficult to remove such impurities as Al and Fe from GC. Therefore, use of GC as a source material in the manufacturing method in PTL 1 above leads to high impurity concentration in a grown SiC crystal. Meanwhile, use of a GC source material as a source material in the manufacturing method in PTL 2 above leads to high concentration of such impurities as Al and Fe in a grown SiC crystal, although boron impurity concentration is low.

When concentration of such impurities as Al and Fe in a grown SiC crystal is high, quality lowers due to these impurities.

The present invention was made in view of the problems above, and an object of the present invention is to provide an SiC crystal and a method of manufacturing an SiC crystal capable of achieving suppressed lowering in quality.

Solution to Problem

An SiC crystal according to the present invention has Fe concentration not higher than 0.1 ppm and Al concentration not higher than 100 ppm.

The present inventor conducted dedicated studies about to which range concentration of Fe and Al impurities in an SiC crystal should be lowered to lessen influence on quality due to impurities. Consequently, the present inventor found that influence on quality of an SiC crystal can be lessened by decreasing Fe and Al to the range above. Therefore, according to the SiC crystal of the present invention, an SiC crystal achieving suppressed lowering in quality can be realized.

In the SiC crystal above, preferably, micropipe density is not higher than 10/cm$^2$. In the SiC crystal above, preferably, etch pit density is not higher than 10000/cm$^2$.

The present inventor conducted dedicated studies in order to improve quality of an SiC crystal, and consequently, succeeded in realizing an SiC crystal in which at least one of micropipe density and etch pit density is in the range above. Then, the present inventor also found that an SiC crystal can suitably be used for a semiconductor device if at least one of micropipe density and etch pit density is in the range above. Therefore, by employing an SiC crystal in which at least one of micropipe density and etch pit density is in the range above, quality of a semiconductor device can be improved.

A method of manufacturing an SiC crystal according to the present invention includes the following steps. SiC powders for polishing (GC) are prepared as a first source material. A first SiC crystal is grown by sublimating the first source material through heating and precipitating an SiC crystal. A second source material is formed by crushing the first SiC crystal. A second SiC crystal is grown by sublimating the second source material through heating and precipitating an SiC crystal.

The present inventor noted GC as a starting source material for manufacturing an SiC crystal and conducted dedicated studies in order to improve quality of an SiC crystal manufactured by using GC. Consequently, the present inventor conceived that, by fabricating a second source material by crushing a first SiC crystal grown with the use of a first source material and growing a second SiC crystal by using the second source material, the second SiC crystal can contain less impurities such as Fe and Al than the first SiC crystal. Based on this conception, the present invention uses as the second source material, a material obtained by crushing the first SiC crystal grown by using GC as the first source material, and hence impurity concentration in the second SiC crystal can be lowered even though GC is used as a starting source material. Therefore, lowering in quality due to impurities in the manufactured SiC crystal can be suppressed.

In the method of manufacturing are SiC crystal above, preferably, in the step of forming a second source material, the second source material is formed such that a plurality of peaks of size distribution are present in a range not smaller than 1 μm and not greater than 3 mm and 95% or more particles are present in a range of ±50% from a center of each peak of the size distribution.

The present inventor conducted dedicated studies in order to further enhance quality of a grown crystal. Consequently, the present inventor noted size distribution of a second source material and completed the invention above. By achieving a grain size of the second source material as above, a filling factor of the second source material in a crucible can be improved. Therefore, the second SiC crystal can be manufactured with lower cost. In addition, since influence on concentration of a sublimation gas of the second source material can be lowered, micropipe density, etch pit density and the like of the second SiC crystal grown by using the second source material can effectively be lowered. Therefore, lowering in quality of a grown SiC crystal can further be lessened.

In the method of manufacturing an SiC crystal above, preferably, in the step of forming a second source material, the second source material having Fe concentration not higher than 0.1 ppm and Al concentration not higher than 100 ppm is formed.

Thus, an SiC crystal having Fe concentration not higher than 0.1 ppm and Al concentration not higher than 100 ppm can be manufactured.

In the method of manufacturing an SiC crystal above, the step of forming a second source material preferably includes the step of washing the crushed first SiC crystal with an acid solution.

Thus, a heavy metal such as Fe in the first SiC crystal can effectively be removed. Therefore, impurity concentration in a manufactured SiC crystal can further be lowered.

The method of manufacturing an SiC crystal above preferably further includes the steps of forming a third source material by crushing the second SiC crystal and growing a third SiC crystal by sublimating the third source material through heating and precipitating an SiC crystal.

The present inventor conceived that, by employing a material obtained by crushing a grown crystal as a source material and growing an SiC crystal, impurity concentration in a grown SiC crystal can be lowered. Therefore, by repeating the step of growing an SiC crystal by using a material obtained by crushing a grown SiC crystal as a source material, impurity concentration in a grown SiC crystal can gradually be lowered. Therefore, by repeating the step of growing an SiC crystal by using a material obtained by crushing a grown crystal as a source material three or more times, lowering in quality of a manufactured SiC crystal can further be suppressed.

Advantageous Effects of Invention

According to the SiC crystal and the method of manufacturing an SiC crystal of the present invention, lowering in quality due to impurities can be suppressed.

DESCRIPTION OF EMBODIMENTS

Figure 1:
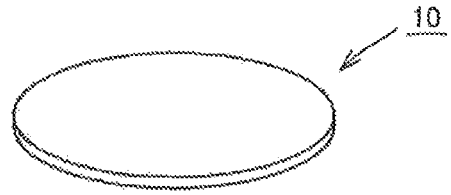
FIG. 1 is a perspective view schematically showing an SiC crystal in an embodiment of the present invention.

An embodiment of the present invention will be described hereinafter with reference to the drawings. In the drawings below, the same or corresponding elements have the same reference characters allotted and description thereof will not be repeated.

FIG. 1 is a perspective view schematically showing an SiC crystal 10 in an embodiment of the present invention. Initially, SiC crystal 10 in one embodiment of the present invention will be described with reference to FIG. 1.

As shown in FIG. 1, SiC crystal 10 is, for example, a substrate having a circular two-dimensional shape. SiC crystal 10 contains Fe at concentration not higher than 0.1 ppm and Al at concentration not higher than 100 ppm. Lower concentration of Fe and Al is preferred, however, from a point of view of ease of realization, Fe concentration is, for example, not lower than 0.002 ppm and Al concentration is, for example, 0.02 ppm. As concentration of Fe and Al is thus lowered, increase in micropipe density or etch pit density can effectively be suppressed and variation in resistivity can also effectively be suppressed. Concentration of Fe and Al is a value measured, for example, with ICP-AES.

SiC crystal 10 has micropipe density preferably not higher than $10/cm^2$ and more preferably not higher than $2/cm^2$. Micropipe density is a value determined, for example, from the number of threading hollow defects counted in a surface etched by immersion in a potassium hydroxide (KOH) melt at 500° C. for 1 to 10 minutes, by using a Nomarski differential interference microscope.

SiC crystal 10 has etch pit density preferably not higher than $10000/cm^2$ and more preferably not higher than $9300/cm^2$. Etch pit density is a value determined, for example, from the number of etch pits counted in a surface etched by immersion in a KOH melt at 500° C. for 1 to 10 minutes, by using a Nomarski differential interference microscope.

SiC crystal 10 is preferably a single crystal. Though a polytype of SiC crystal 10 is not particularly limited, for example, 4H—SiC is preferred.

In succession, a method of manufacturing SiC crystal 10 in the present embodiment will be described with reference to FIGS. 1 to 6. In the present embodiment, SiC crystal 10 is manufactured with a sublimation method. It is noted that FIGS. 2, 3, 5, and 6 are each a cross-sectional view schematically showing a process for manufacturing an SiC crystal in the present embodiment. FIG. 4 is a diagram for illustrating size distribution of a second source material in the present embodiment.

A primary construction of an SiC crystal manufacturing apparatus will initially be described with reference to FIG. 2 and the like. The manufacturing apparatus includes a crucible 101 and a heating portion (not shown) for heating crucible 101. The heating portion is arranged, for example, around an outer circumference of crucible 101.

In the present embodiment, crucible 101 has a lower portion for holding a source material and an upper portion functioning as a cover of the lower portion for holding the source material. Crucible 101 is made, for example, of graphite.

Though the manufacturing apparatus may include various elements other than the above, for the sake of convenience of description, illustration and description of these elements will not be provided.

Figure 2:
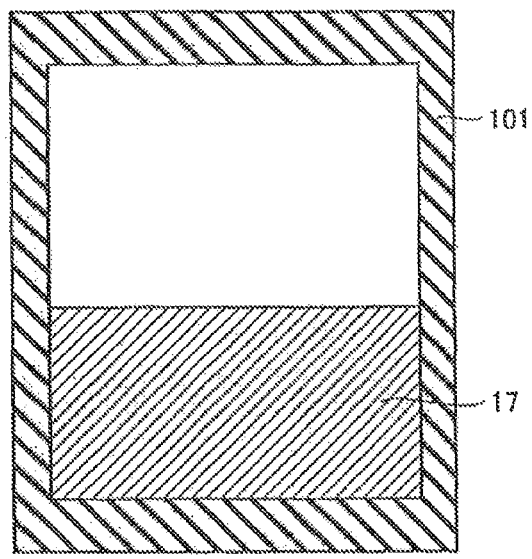
FIG. 2 is a cross-sectional view schematically showing a process for manufacturing an SiC crystal in the embodiment of the present invention.

As shown in FIG. 2, SiC powders for polishing (GC) are prepared as a first source material 17. For example, commercially available GC is employed. Prepared first source material 17 is placed in the lower portion of crucible 101.

Figure 3:
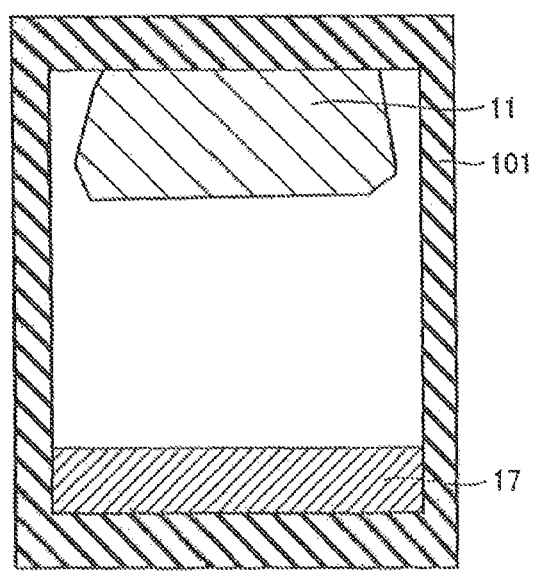
FIG. 3 is a cross-sectional view schematically showing the process for manufacturing an SiC crystal in the embodiment of the present invention.
Figure 4:
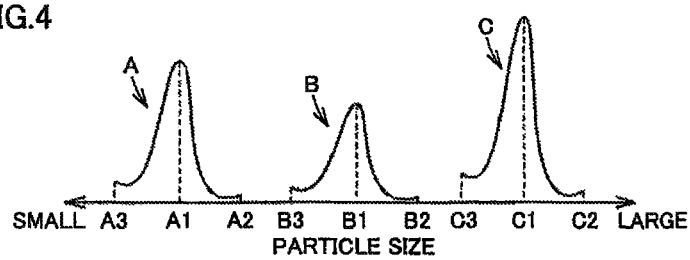
FIG. 4 is a diagram for illustrating size distribution of a second source material in the embodiment of the present invention.

Then, as shown in FIG. 3, a first SiC crystal 11 is grown by sublimation of first source material 17 through heating and precipitation from a gas of first source material 17. In growing first SiC crystal 11 by using GC as a source material, it is preferred not to arrange a seed substrate.

Specifically, first source material 17 is heated by the heating portion at a temperature at which first source material 17 sublimates. As a result of this heating, first source material 17 sublimates and a sublimation gas is generated. This sublimation gas is again solidified at a position opposed to the first source material in crucible 101, that is, in the upper portion of crucible 101, that is set at a temperature lower than first source material 17.

By way of example of a growing temperature, for example, first source material 17 is held at a temperature from 2000° C. to 3000° C., and a position opposed to first source material 17 is held at a temperature from 1900° C. to 2200° C., which is lower than a temperature of first source material 17. In addition, an atmospheric pressure in crucible 101 is held preferably at 400 Torr or lower. Thus, first SiC crystal 11 grows at a position opposed to first source material 17. First SiC crystal 11 thus grown is, for example, polycrystalline.

By setting a temperature of first source material 17 to 2000° C. or higher, a growth rate of first SiC crystal 11 can be increased. By setting a temperature of first source material 17 to 3000° C. or lower, damage of crucible 101 can be suppressed. A growing temperature may be held at a constant temperature during growth, however, it may also be varied at a certain rate during growth.

In addition, by setting an atmospheric pressure in crucible 101 to 400 Torr or lower, a growing rate can be increased.

Then, a second source material 12 (see FIG. 5) is formed by crushing first SiC crystal 11. In this step, for example, the following are performed. Specifically, the inside of crucible 101 is cooled to a room temperature. Then, grown first SiC crystal 11 is taken out of crucible 101. This first SiC crystal 11 is crushed, for example, with a crusher. It is noted that a crushing method is not particularly limited.

In this step, as shown in FIG. 4, second source material 12 is preferably formed such that a plurality of (in FIG. 4, three peaks A, B and C) size distribution peaks are present in a range not smaller than 1 gm and not greater than 3 mm and 95% or more particles are present in a range of ±50% from respective centers A1, B1 and C1 of size distribution peaks A, B and C. As centers A1, B1 and C1 of size distribution peaks A, B and C are not smaller than 1 gm and not greater than 3 mm and 95% or more particles are present in the range of ±50% from respective centers A1, B1 and C1 of size distribution peaks A, B and C, a filling factor at the time when crucible 101 is filled with second source material 12 can be increased. Thus, a time period for growth in growing a second SiC crystal 14 by using this second source material 12 is shortened and influence on concentration of a gas of second source material 12 that sublimated during growth can be suppressed. Therefore, quality of second SiC crystal 14 grown by using this second source material 12 can be enhanced.

From such a point of view, second source material 12 is preferably formed such that center A1 of smallest grain size peak A is present in a range not smaller than 1 μm and not greater than 100 μm and center C1 of largest grain size peak C is present in a range not smaller than 200 μm and not greater than 3 mm. Similarly, such second source material 12 that peak A includes particles not less than 10 weight % and not more than 50 weight %, peak C includes particles not less than 30 weight % and not more than 80 weight %, and the remainder represents other peak (in FIG. 4, peak B) is further preferably formed.

Here, the phrase above that "95% or more particles are present in a range of ±50% from respective centers A1, B1 and C1 of size distribution peaks A, B and C" means that 95% or more of the whole particles of second source material 12 is present between 150% particle sizes A2, B2 and C2 with respect to particle sizes at centers A1, B1 and C1 and 50% particle sizes A3, B3 and C3 with respect to particle sizes at centers A1, B1 and C1, respectively. It is noted that the number of particle size distribution peaks may be two, or four or more.

In addition, "size distribution" above is a value, for example, determined in conformity with JIS R6001 1998.

Though a method of forming second source material 12 having size distribution as above is not particularly limited, second source material 12 can be formed, for example, by crushing first SiC crystal 11 and thereafter making selection so as to achieve size distribution in the range above. It is noted that second source material 12 may be formed by crushing first SiC crystal 11 so as to have size distribution as above.

In addition, after first SiC crystal 11 is crushed, crushed first SiC crystal 11 is preferably washed with an acid solution. Though an acid solution is not particularly limited, aqua regia is preferably used. By using an acid solution, in particular aqua regia, such a heavy metal as Fe attached to first SiC crystal 11 during crushing can be removed. In addition, washing, for example, with hydrochloric acid is further preferred.

Second source material 12 formed as above preferably contains Fe at concentration not higher than 0.1 ppm and Al at concentration not higher than 100 ppm. In addition, second source material 12 formed as above is placed in the lower portion of crucible 101.

Figure 5:
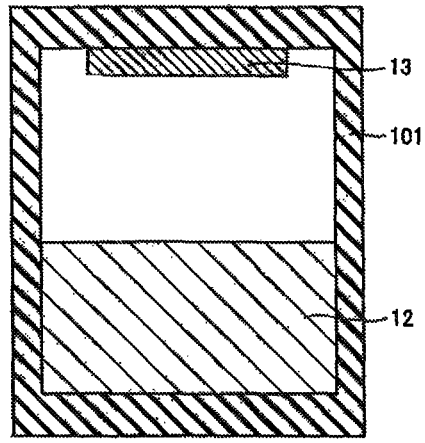
FIG. 5 is a cross-sectional view schematically showing the process for manufacturing an SiC crystal in the embodiment of the present invention.

Then, as shown in FIG. 5, a seed substrate 13 is arranged in the upper portion of crucible 101 so as to be opposed to second source material 12 in crucible 101. A main surface of seed substrate 13 may have a circular or quadrangular shape. Though a material for seed substrate 13 is not particularly limited, from a point of view of enhancing quality of grown second SiC crystal 14, an SiC substrate is preferred and the material is more preferably identical in grown polytype (crystal polymorphism), which means that, for example, in a case where an SiC crystal intended to be grown is 4H—SiC, seed substrate 13 is also 4H—SiC. It is noted that this step may be omitted.

Figure 6:
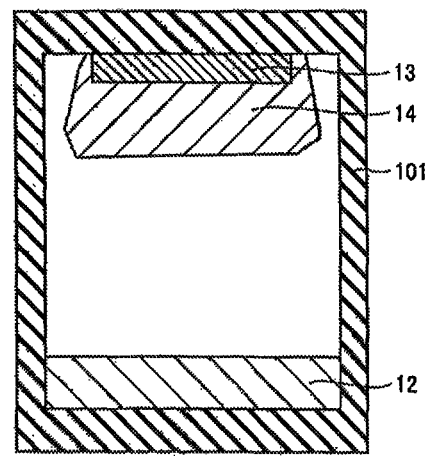
FIG. 6 is a cross-sectional view schematically showing the process for manufacturing an SiC crystal in the embodiment of the present invention.

Then, as shown in FIG. 6, second SiC crystal 14 is grown by sublimation of second source material 12 through heating and precipitation from a gas of second source material 12. In the present embodiment, second SiC crystal 14 is grown on seed substrate 13. Second SiC crystal 14 is preferably a single crystal. Since a method of growing second SiC crystal 14 is substantially the same as the method of growing first SiC crystal 11, description thereof will not be repeated.

Then, the inside of crucible 101 is cooled to a room temperature. Then, an ingot including seed substrate 13 and second SiC crystal 14 is taken out of crucible 101. This ingot may be employed as SiC crystal 10 shown in FIG. 1. Namely, SiC crystal 10 in FIG. 1 may be manufactured by growing first SiC crystal 11 by using first source material 17, forming second source material 12 by crushing first SiC crystal 11, and growing second SiC crystal 14 by using second source material 12.

In order to further decrease impurities in SiC crystal 10, the step above is preferably repeated. Namely, the step of forming a third source material by crushing second SiC crystal 14 and the step of growing a third SiC crystal by sublimation of the third source material through heating and precipitation from a gas of the third source material are preferably further performed. The steps in this one cycle can decrease impurities, for example, by approximately 10%.

As the steps above are repeated, concentration of impurities in grown SiC crystal 10 is lowered, however, from a point of view of manufacturing an SiC crystal preferable for use in a semiconductor device, the steps above are preferably repeated until concentration of Fe in the grown SiC crystal is not higher than 0.1 ppm and concentration of Al therein is not higher than 100 ppm. In addition, in order to reliably fabricate such an SiC crystal, an SiC crystal is further preferably manufactured by repeating the steps above until a source material having Fe concentration not higher than 0.1 ppm and Al concentration not higher than 100 ppm can be fabricated and by growing an SiC crystal by using this source material.

By performing the steps above, an ingot including a seed substrate and an SiC crystal formed on the seed substrate can be manufactured. This ingot may be employed as SiC crystal 10 shown in FIG. 1. Alternatively, SiC crystal 10 shown in FIG. 1 may be manufactured by removing seed substrate 13 from the ingot. In a case of removal, only seed substrate 13 may be removed or seed substrate 13 and a part of the grown SiC crystal may be removed.

A removal method is not particularly limited, and for example, such a mechanical removal method as cutting, grinding and cleavage can be employed. Cutting refers to mechanical removal of at least seed substrate 13 from an ingot, for example, by using a wire saw. Grinding refers to grinding in a direction of thickness by bringing a grindstone into contact with a surface while it is rotating. Cleavage refers to division of a crystal along a crystal lattice plane. It is noted that such a chemical removal method as etching may be employed.

In a case where manufactured SiC crystal 10 has a large thickness, SiC crystal 10 shown in FIG. 1 may be manufactured by cutting a plurality of SiC crystal slices from the grown SiC crystal. In this case, cost for manufacturing one slice of SiC crystal 10 can be lowered.

Thereafter, one surface or opposing surfaces of an SiC crystal may be planarized by grinding, polishing or the like, as necessary.

As described above, a method of manufacturing SiC crystal 10 in the embodiment of the present invention includes the steps of preparing SiC powders for polishing as first source material 17, growing first SiC crystal 11 by sublimating first source material 17 through heating and precipitating an SiC crystal, forming second source material 12 by crushing first SiC crystal 11, and growing second SiC crystal 14 by sublimating second source material 12 through heating and precipitating an SiC crystal.

The present inventor conceived that, by fabricating second source material 12 by crushing first SiC crystal 11 grown with the use of first source material 17 and growing second SiC crystal 14 by using second source material 12, second SiC crystal 14 can contain impurities such as Fe and Al less than first SiC crystal 11. According to the method of manufacturing SiC crystal 10 in the present embodiment, first SiC crystal 11 is grown by using a GC source material as first source material 17, second source material 12 is formed by crushing this first SiC crystal 11, and second SiC crystal 14 is grown by using second source material 12. Therefore, even with the use of GC high in concentration of Fe and Al as a starting source material, second SiC crystal 14 can be lower in impurity concentration than first SiC crystal 11. Therefore, lowering in quality due to impurities in manufactured SiC crystal 10 can be lessened.

Further, GC is readily available, which is useful in industrialized manufacturing of SiC crystal 10. Thus, SiC crystal 10 can be manufactured with lower cost.

According to such a method of manufacturing SiC crystal 10 in the present embodiment, SiC crystal 10 having Fe concentration not higher than 0.1 ppm and Al concentration not higher than 100 ppm can be manufactured. The present inventor conducted dedicated studies about to which range concentration of Fe and Al impurities in SiC crystal 10 should be lowered to lessen influence on quality due to these impurities. Consequently, the present inventor found that influence on quality of SiC crystal 10 (for example, crystal defects such as micropipes or etch pits) can be lessened by decreasing Fe and Al to the range above. Therefore, according to SiC crystal 10 in the present embodiment, lowering in quality can be suppressed.

EXAMPLES

In the present example, an effect of growing first SiC crystal 11 by using GC as first source material 17, forming second source material 12 by crushing first SiC crystal 11, and growing second SiC crystal 14 by using second source material 12 was examined.

Present Inventive Example 1

In Present Inventive Example 1, an SiC crystal was manufactured basically in accordance with the method of manufacturing an SiC crystal in the embodiment described above.

Specifically, initially, generally commercially available GC for abrasive was prepared as first source material 17. This first source material was arranged in the lower portion of crucible 101 as shown FIG. 2, while nothing was arranged in a cover of crucible 101 opposed to an outermost surface of first source material 17.

Then, first SiC crystal 11 was grown by sublimation of first source material 17 through heating and precipitation of a gas of first source material 17. Here, a temperature of the lower portion of crucible 101, that is, first source material 17, was set to 2300° C., a temperature of the upper portion of crucible 101 was set to 2000° C., and a pressure in crucible 101 was set to 1 Torr. Grown first SiC crystal 11 was polycrystalline.

Then, first SiC crystal 11 was crushed. Crushing was carried out by using a crusher. Thereafter, crushed first SiC crystal 11 was washed with aqua regia and further washed with hydrochloric acid. Then, second source material 12 was formed by using crushed first SiC crystal 11 such that there are three size distribution peaks A, B and C, the center of smallest grain size peak A was less than 1 μm, and the center of largest grain size peak C exceeded 3 mm, as shown in FIG. 4. In addition, second source material 12 was formed such that 95% or more particles were present in the range of ±50% from the center of each size distribution peak. Size distribution of second source material 12 was determined in conformity with JIS R6001 1998. This second source material 12 was arranged in the lower portion in crucible 101.

Then, as shown in FIG. 5, 4 H—SiC having micropipe density of 10/cm$^2$ was prepared as seed substrate 13. This seed substrate 13 was arranged in the upper portion in crucible 101 to be opposed to second source material 12.

Then, second SiC crystal 14 was grown by sublimation of second source material 12 through heating and precipitation of a gas of second source material 12. The method of growing second SiC crystal 14 was the same as the method of growing first SiC crystal 11.

By performing the steps above, an SiC crystal in Present Inventive Example 1 was manufactured. Namely, second SiC crystal 14 was adopted as the SiC crystal in Present Inventive Example 1.

Present Inventive Example 2

A method of manufacturing an SiC crystal in Present Inventive Example 2 was basically the same as in Present Inventive Example 1, however, it was different in that second source material 12 of which center of largest grain size peak C was not smaller than 200 µm and not greater than 3 mm was formed in the step of forming second source material 12.

Present Inventive Example 3

A method of manufacturing an SiC crystal in Present Inventive Example 3 was basically the same as in Present Inventive Example 1, however, it was different in that second source material 12 of which center of smallest grain size peak A was not smaller than 1 µm and not greater than 100 µm was formed in the step of forming second source material 12.

Present Inventive Example 4

A method of manufacturing an SiC crystal in Present Inventive Example 4 was basically the same as in Present Inventive Example 1, however, it was different in that second source material 12 of which center of smallest grain size peak A was not smaller than 1 µm and not greater than 100 µm and of which center of largest grain size peak C was not smaller than 200 µm and not greater than 3 mm was formed in the step of forming second source material 12.

Comparative Example 1

A method of manufacturing an SiC crystal in Comparative Example 1 was basically the same as in Present Inventive Example 1, however, it was different in that the step of forming a second source material by crushing first SiC crystal 11 was not performed. Namely, first SiC crystal 11 was adopted as the SiC crystal in Comparative Example 1.

(Evaluation Method)

Al concentration, Fe concentration, micropipe density, and etch pit density of SiC crystals in Present Inventive Examples 1 to 4 and Comparative Example 1 were determined as follows.

Al and Fe concentrations were determined with ICP (Inductive Coupled Plasma)-AES (Atomic Emission Spectrometry). It is noted that Al detection limit was 0.02 ppm and Fe detection limit was 0.002 ppm.

Micropipe density (MPD) was determined based on the number of threading hollow defects in an etched surface of an SiC crystal counted by using a Nomarski differential interference microscope, after the SiC crystals in Present Inventive Examples 1 to 4 and Comparative Example 1 were sliced to have a plane distant by 10 mm from a plane in contact with seed substrate 13 and immersed in a KOH melt at 500° C. for 1 to 10 minutes. In addition, micropipe density of the SiC crystal grown on seed substrate 13 with respect to micropipe density of seed substrate 13 (MPD of crystal/MPD of seed substrate in Table 1) was also calculated.

Etch pit density (EPD) was determined based on the number of etch pits in an etched surface of an SiC crystal counted by using a Nomarski differential interference microscope, after the SiC crystals in Present Inventive Examples 1 to 4 and Comparative Example 1 were sliced to have a plane distant by 10 mm from a plane in contact with seed substrate 13 and immersed in a KOH melt at 500° C. for 1 to 10 minutes.

Table 1 below shows these results.

TABLE 1

|  | Present Inventive Example 1 | Present Inventive Example 2 | Present Inventive Example 3 | Present Inventive Example 4 | Comparative Example 1 |
|---|---|---|---|---|---|
| Center of Grain Size | A < 1 µm<br>3 mm < C | A < 1 µm<br>200 µm ≤ C ≤ 3 mm | 1 µm ≤ A ≤ 100 µm<br>3 mm < C | 1 µm ≤ A ≤ 100 µm<br>200 µm ≤ C ≤ 3 mm | —<br>(Not Crushed) |
| Al Concentration | 0.02 to 100 ppm | 0.02 to 100 ppm | 0.02 to 100 ppm | 0.02 to 100 ppm | 105 ppm |
| Fe Concentration | 0.002 to 0.1 ppm | 0.002 to 0.1 ppm | 0.002 to 0.1 ppm | 0.002 to 0.1 ppm | 0.15 ppm |
| MPD of Crystal/MPD of Seed Substrate | 85 to 95% | 55 to 80% | 40 to 60% | Less than 40% | 100% or higher |
| MPD of Crystal (Count/cm$^2$) | 6 to 10/cm$^2$ | 5 to 8/cm$^2$ | 3 to 6/cm$^2$ | 2/cm$^2$ or less | 12 to 20/cm$^2$ |
| EPD of Crystal (Count/cm$^2$) | 8000 to 9300/cm$^2$ | 6500 to 7800/cm$^2$ | 4800 to 6000/cm$^2$ | 4100 to 5200/cm$^2$ | 12000 to 15000/cm$^2$ |

(Evaluation Results)

As shown in Table 1, Present Inventive Examples 1 to 4 in which first SiC crystal 11 was grown by using first source material 17, second source material 12 was formed by crushing first SiC crystal 11, and second SiC crystal 14 was grown by using second source material 12 could be lower in Al and Fe concentrations than Comparative Example 1. In addition, it was found that, as a result of such manufacturing, an SiC crystal containing Fe at concentration not higher than 0.1 ppm and Al at concentration not higher than 100 ppm could be realized.

In addition, it was found that the SiC crystals in Present Inventive Examples 1 to 4 could be lower in micropipe density and etch pit density than the SiC crystal in Comparative Example 1. Moreover, it was also found that takeover of micropipes in seed substrate 13 was less in the SiC crystals in Present Inventive Examples 1 to 4 than in the SiC crystal in Comparative Example 1.

Further, it was found that Present inventive Example 4 in which the second source material was formed in the step of forming a second source material such that there were a plurality of size distribution peaks in the range not smaller than 1 µm and not greater than 3 mm and 95% or more particles were present in the range of ±50% from the center of each size distribution peak could be further lower in micropipe density and etch pit density than Present Inventive Examples 1 to 3. Furthermore, it was also found that takeover of micropipes in seed substrate 13 was further less.

From the foregoing, it was confirmed in the present examples that impurities could be decreased and lowering in quality could be suppressed by growing first SiC crystal 11 by using first source material 17, forming second source material 12 by crushing first SiC crystal 11, and growing second SiC crystal 14 by using second source material 12.

Though the embodiment of the present invention has been described above, combination of features in the embodiment as appropriate is also originally intended. It should be understood that the embodiment disclosed herein is illustrative and non-restrictive in every respect. The scope of the present invention is defined by the terms of the claims, rather than the embodiment described above, and is intended to include any modifications within the scope and meaning equivalent to the terms of the claims.

REFERENCE SIGNS LIST

10 SiC crystal; 11 first SiC crystal; 12 second source material; 13 seed substrate; 14 second SiC crystal; 17 first source material; 101 crucible; A, B, C peak; A1, B1, C1 center; and A2, A3, B2, B3, C2, C3 peak.

The invention claimed is:

1. A method of manufacturing a silicon carbide crystal, comprising the steps of:
    preparing powders of silicon carbide for polishing as a first source material;
    growing a first silicon carbide crystal by sublimating said first source material through heating and precipitating a silicon carbide crystal;
    forming a second source material by crushing said first silicon carbide crystal; and
    growing a second silicon carbide crystal by sublimating said second source material through heating and precipitating a silicon carbide crystal,
    in said step of forming a second source material, said second source material is formed such that a plurality of peaks of size distribution are present in a range not smaller than 1 µm and not greater than 3 mm and 95% or more particles are present in a range of ±50% from a center of each peak of said size distribution.

2. The method of manufacturing a silicon carbide crystal according to claim 1, wherein
    in said step of forming a second source material, said second source material having concentration of iron not lower than 0.002 ppm and not higher than 0.1 ppm and concentration of aluminum not lower than 0.02 ppm and not higher than 100 ppm is formed.

3. The method of manufacturing a silicon carbide crystal according to claim 1, wherein
    said step of forming a second source material includes the step of washing crushed said first silicon carbide crystal with an acid solution.

4. The method of manufacturing a silicon carbide crystal according to claim 1, further comprising the steps of:
    forming a third source material. by crushing said second silicon carbide crystal; and
    growing a third silicon carbide crystal by sublimating said third source material through heating and precipitating a silicon carbide crystal.

* * * * *